(12) United States Patent
Chu

(10) Patent No.: US 7,777,126 B2
(45) Date of Patent: Aug. 17, 2010

(54) THERMOELECTRIC DEVICE WITH THIN FILM ELEMENTS, APPARATUS AND STACKS HAVING THE SAME

(75) Inventor: Hsu-Shen Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/185,188

(22) Filed: Aug. 4, 2008

(65) Prior Publication Data

US 2009/0165835 A1      Jul. 2, 2009

(30) Foreign Application Priority Data

Dec. 28, 2007   (TW) .................................. 96150972

(51) Int. Cl.
*H01L 35/28* (2006.01)
(52) U.S. Cl. ...................... 136/212; 136/208; 136/203; 136/225; 62/3.2
(58) Field of Classification Search ................ 136/243, 136/258, 260, 263, 264, 212, 208, 203, 225; 257/292, 293; 62/3.2
See application file for complete search history.

(56) References Cited

U.S. PATENT DOCUMENTS

| | | | |
|---|---|---|---|
| 2,919,553 A * | 1/1960 | Fritts | 62/3.3 |
| 4,497,973 A * | 2/1985 | Heath et al. | 136/212 |
| 5,022,928 A * | 6/1991 | Buist | 136/212 |
| 5,228,923 A * | 7/1993 | Hed | 136/208 |
| 5,562,776 A * | 10/1996 | Sapru et al. | 118/723 VE |
| 6,368,718 B1 * | 4/2002 | Schmidt | 428/457 |
| 6,686,532 B1 * | 2/2004 | Macris | 136/204 |
| 6,818,470 B1 | 11/2004 | Acklin | |
| 6,828,579 B2 | 12/2004 | Ghamaty et al. | |
| 7,132,680 B2 * | 11/2006 | Afzali-Ardakani et al. | 257/40 |

FOREIGN PATENT DOCUMENTS

TW      1264837      10/2006
TW    200634263      10/2006

* cited by examiner

*Primary Examiner*—Jeffrey T Barton
*Assistant Examiner*—Devina Pillay
(74) *Attorney, Agent, or Firm*—Thomas, Kayden, Horstemeyer & Risley

(57) ABSTRACT

A thermoelectric device at least includes a ring-shaped insulated substrate and plural sets of thermoelectric thin film material pair (TEP) disposed thereon. The ring-shaped insulated substrate has an inner rim, an outer rim and a first surface. The sets of TEP electrically connected to each other are disposed on the first surface of the ring-shaped insulated substrate. Each set of TEP includes a P-type and an N-type thermoelectric thin film elements (TEE) electrically connected to each other. Also, the N-type TEE of each set is electrically connected to the P-type TEE of the adjacent set of TEP. When a current flows through the sets of TEP along a direction parallel to the surfaces of P-type and N-type thermoelectric thin film elements, a temperature difference is generated between the inner rim and the outer rim of the ring-shaped insulated substrate.

24 Claims, 7 Drawing Sheets

THERMOELECTRIC DEVICE WITH THIN FILM ELEMENTS, APPARATUS AND STACKS HAVING THE SAME

This application claims the benefit of Taiwan application Serial No. 96150972, filed Dec. 28, 2008, the subject matter of which is incorporated herein by reference.

BACKGROUND OF THE INVENTION

1. Field of the Invention

The invention relates in general to a thermoelectric device with thin film elements and stacks having the same, and more particularly to the thermoelectric device with thin film elements and stacks having the same with highly thermoelectric efficiency of power conversion for cooling/heating and electricity generation.

2. Description of the Related Art

A thermoelectric device is a module with properties of direct conversion of temperature differences to electric voltage and vice versa. Due to this property of thermoelectric conversion, both cooling/heating and power conversion applications are possible with emerging thermoelectric technologies. For example, this thermoelectric effect can be used to generate electricity, to measure temperature, to cool/heat objects. Simply put, a thermoelectric device can cool/heat an attached object when a current is flown in an appropriate direction through the thermoelectric material, and it is applicable in the field requiring cooling/heating technologies. Further, a thermoelectric device can produce electrical energy when types of thermoelectric material with a temperature difference between two sides, and it is applicable in the field of generating electricity.

FIG. 1 is a cross-sectional view of a conventional thermoelectric apparatus. The conventional thermoelectric apparatus of FIG. 1 is manufactured using two electricity-insulated substrates $121a/121b$ with the conductive metal layers $111a/111b$, a P-type thermoelectric block 101 and an N-type thermoelectric block 102 sandwiched between them. The efficiency of thermoelectric power conversion is mostly determined by the properties of the P-type thermoelectric block 101 and the N-type thermoelectric block 102. As shown in FIG. 1, the upright P-type thermoelectric block 101 and the N-type thermoelectric block 102 are arranged electrically in series using the conductive metal layers $111a/111b$. The electricity-insulated substrates $121a/121b$ could be made of ceramic material for adding rigidity and the necessary electrical insulation. The material of N-type thermoelectric block 102 has an excess of electrons, while the material of P-type thermoelectric block 101 has a deficit of electrons. One P and one N make up a couple, and a thermoelectric module can contain one to several hundred couples. Take a thermoelectric cooler/heater application as example. When a voltage is applied, a current flows in the P-type and N-type thermoelectric blocks 101/102 upward or downward, and a different temperature on each side of the substrate is created, which the direction of current flow is parallel to the direction of heat transfer. The temperature difference created by the thermoelectric device can be used for cooling or heating an object. In the application of electricity generator by using temperature difference, the direction of heat transfer is still parallel to the direction of current flow. However, the thermoelectric power conversion of this conventional thermoelectric apparatus is inefficient due to the limitation of bulky thermoelectric material property with low Figure of Merit (ZT) value. Typically, the maximum cooling capacity of the conventional thermoelectric apparatus is about 3~5 $W/cm^2$, and the electricity generating efficiency is about 2~3% when a temperature difference of 200° C. is applied to the cool and heat ends. It would be a direct and effective method of increasing the efficiency of thermoelectric power conversion by constructing the thermoelectric materials with high ZT value into the device.

Many experiments studying thermoelectric materials and researches attempting to improve performance of thermoelectric devices have been underway for the past 20-30 years with not much success. Workers in the thermoelectric industry have tried to make a breakthrough in the reported ZT value=1. The value of the figure of merit, commonly expressed as the dimensionless figure of merit ZT, is usually proportional to the efficiency of the device. In 1993, Hicks and Dresselhaus et al (MIT professors) have published the articles that project theoretically very high ZT value as the thickness of thermoelectric material are made progressively thinner (ex: nano-dimension). In 2001, Venkatasubramanian et al. (Research Triangle Institute, United State) have discovered a superlattice of thin film of P-type $Bi_2Te_3/Sb_2Te_3$ with a ZT value of about 2.4 at room temperature, which breakthrough the bottleneck of ZT value of 1. In 2004, Hi-Z Technology, Inc. (San Diego of United State) studied a quantum well thin film of P-type B4C/B9C and N-type Si/SiGe, and has claimed a ZT value lager than 3 can definitely be achieved. Accordingly, the thermoelectric thin films to date are known to be good at high ZT value, and definitely superior to the conventional bulky thermoelectric material. When the thermoelectric thin films are used for fabricating the thermoelectric device, the efficiency of thermoelectric power conversion can be greatly increased. Additionally, the thermoelectric thin films are especially suitable for manufacturing the thermoelectric micro-devices since less material (i.e. only layers of thin film) is required. Thus, the device with thermoelectric thin films is a potential star in the development of the related fields such as the applications of micro-cooling and thermoelectric generator.

However, the performance of a conventional device having thermoelectric thin films constructed based on a typical semiconductor is not very well. FIG. 2 is a cross-sectional view of a conventional device having thermoelectric thin films. As shown in FIG. 2, a P-type thermoelectric thin film 201 and an N-type thermoelectric thin film 202 are disposed between two much thicker substrates (i.e. an upper substrate $221a$ and a lower substrate $221b$). Also, the conventional device further includes the metal pillars 231 and the conductive metal layers $211a/211b$, which are disposed between the thermoelectric thin films 201/202 and the upper/lower substrates $221a/221b$. The P-type thermoelectric thin film 201 and the N-type thermoelectric thin film 202 are adhered to the upper substrate $221a$ through the soldering layer 241, and the metal pillars 231 are adhered to the lower substrate $221b$ through the soldering layer 242.

Although it have been proved that the thermoelectric thin films have high ZT value, the performance of the thermoelectric device is not as good as expected if the thermoelectric thin films are directly adopted into the conventional structure of device. As shown in FIG. 2, the P-type thermoelectric thin film 201 and the N-type thermoelectric thin film 202 are generally about 10 nanometers to 100 micrometers thick, while the upper and lower substrates $221a/221b$ are much thicker. Thus, there is an extremely close distance (about the thickness of the thermoelectric thin films 201/202) between the hot side and the cold side of the conventional thermoelectric device of FIG. 2, and a heat flux quickly transferring in a short distance between the hot side and the cold side has an effect on the efficiency of the thermoelectric device. On the other words, it is not sufficient to sustain the temperature difference between the hot side and the cold side of the thermoelectric device in a meaningful time. Moreover, factors that affect the electrical resistance and heat transmission resistance of the interface between the metal layers and the thermoelectric thin films have become considerable. Joule's heating also affects the efficiency of thermoelectric device. Therefore, the performances of conventional thermoelectric structure inside which the thermoelectric thin films have been inserted are not as great as expected.

SUMMARY OF THE INVENTION

It is therefore an object of the present invention to provide a thermoelectric device with thin film elements, apparatus and stacks having the same. The structure designed according to the present invention has sufficient distance between the hot side and the cold side of the thermoelectric device, and the conventional heat-reflux problem (resulted from the extremely small distance between the hot side and the cold side) can be avoided. Thus, the efficiency of the thermoelectric device constructed according to the embodiments of the present invention can be effectively improved by using high ZT thermoelectric materials without a waste.

According to the first aspect of the present invention, a thermoelectric device with thermoelectric thin film elements is provided. The thermoelectric device at least comprises a ring-shaped insulated substrate and plural sets of thermoelectric thin film material pair (TEP). The ring-shaped insulated substrate has an inner rim, an outer rim and a first surface. The sets of TEP are disposed on the first surface of the ring-shaped insulated substrate and electrically connected to each other. Each set of TEP includes a P-type thermoelectric thin film element (TEE) and an N-type TEE electrically connected to each other, and the N-type TEE of each set of TEP is electrically connected to the P-type TEE of the adjacent set of TEP. When a current flows through the sets of TEP orderly along a direction parallel to the surfaces of P-type and N-type thermoelectric thin film elements, a temperature difference is generated between the inner rim and the outer rim of the ring-shaped insulated substrate.

According to the second aspect of the present invention, a thermoelectric apparatus with thermoelectric thin film elements is provided. The thermoelectric apparatus at least comprises a ring-shaped insulated substrate, plural first sets of thermoelectric thin film material pair (TEP) and a first insulation layer. The ring-shaped insulated substrate has an inner rim, an outer rim, a top surface and a bottom surface. The first sets of TEP is disposed on the top surface of the ring-shaped insulated substrate and electrically connected to each other. Each first set of TEP includes a P-type thermoelectric thin film element (TEE) and an N-type TEE electrically connected to each other, and the N-type TEE of each first set of TEP is electrically connected to the P-type TEE of the adjacent first set of TEP. The first insulation layer is disposed on the top surface of the ring-shaped insulated substrate and covers the first sets of TEP. When a current flows through the first sets of TEP orderly along a direction parallel to the surfaces of P-type and N-type thermoelectric thin film elements, a temperature difference is generated between the inner rim and the outer rim of the ring-shaped insulated substrate.

According to the third aspect of the present invention, a thermoelectric stack with thermoelectric thin film elements is provided. The thermoelectric stack comprises a first insulation layer, a first thermoelectric device, a second insulation layer, a second thermoelectric device, and a third insulation layer. The structures of the first and second thermoelectric devices are disclosed above. The first insulation layer is disposed on the top surface of the ring-shaped insulated substrate and covers the sets of TEP. The second insulation layer is disposed between the first thermoelectric device and the second thermoelectric device. The third insulation layer is disposed on the bottom surface of the ring-shaped insulated substrate of the second thermoelectric device. When a current flows through the sets of TEP of the first and second thermoelectric devices orderly along a direction parallel to the surfaces of P-type and N-type thermoelectric thin film elements, a temperature difference is generated between the inner rims and the outer rims of the ring-shaped insulated substrates.

Other objects, features, and advantages of the present invention will become apparent from the following detailed description of the preferred but non-limiting embodiment. The following description is made with reference to the accompanying drawings.

BRIEF DESCRIPTION OF THE DRAWINGS

FIG. 5A and FIG. 5B are cross-sectional view of a thermoelectric apparatus having thermoelectric device with thin film elements according to the second embodiment of the present invention, wherein FIG. 5B illustrates the apparatus of FIG. 5A after assembly.

FIG. 6A and FIG. 6B are cross-sectional view of a thermoelectric apparatus having thermoelectric device with thin film elements assembled with first type heat conduction modules according to the present invention, wherein FIG. 6B illustrates the structure of FIG. 6A after assembly.

FIG. 7A and FIG. 7B are cross-sectional view of the thermoelectric apparatus of the present invention assembled with second type heat conduction modules, wherein FIG. 7B illustrates the structure of FIG. 7A after assembly.

FIG. 8A and FIG. 8B are cross-sectional view of a stack of thermoelectric devices with thin film elements according to the third embodiment of the present invention, wherein FIG. 8B illustrates the stack of FIG. 8A after assembly.

DETAILED DESCRIPTION OF THE INVENTION

The present invention provides a thermoelectric device with thin film elements and stacks having the same. The thermoelectric device which incorporates high thermoelectric figure of merit (ZT) thin film material is constructed with special design, so as to achieve the objective of highly efficient thermoelectric power conversion.

In the present invention, three embodiments are illustrated herein. The first, second and third embodiments demonstrate a thermoelectric device with thin film elements, an apparatus having the same, a stack having the same according to the present invention, respectively. It is noted that the embodiment disclosed herein is used for illustrating the present invention, but not for limiting the scope of the present invention. Additionally, the drawings used for illustrating the embodiment and applications of the present invention only show the major characteristic parts in order to avoid obscuring the present invention. Accordingly, the specification and the drawings are to be regard as an illustrative sense rather than a restrictive sense.

First Embodiment

Figure 1:
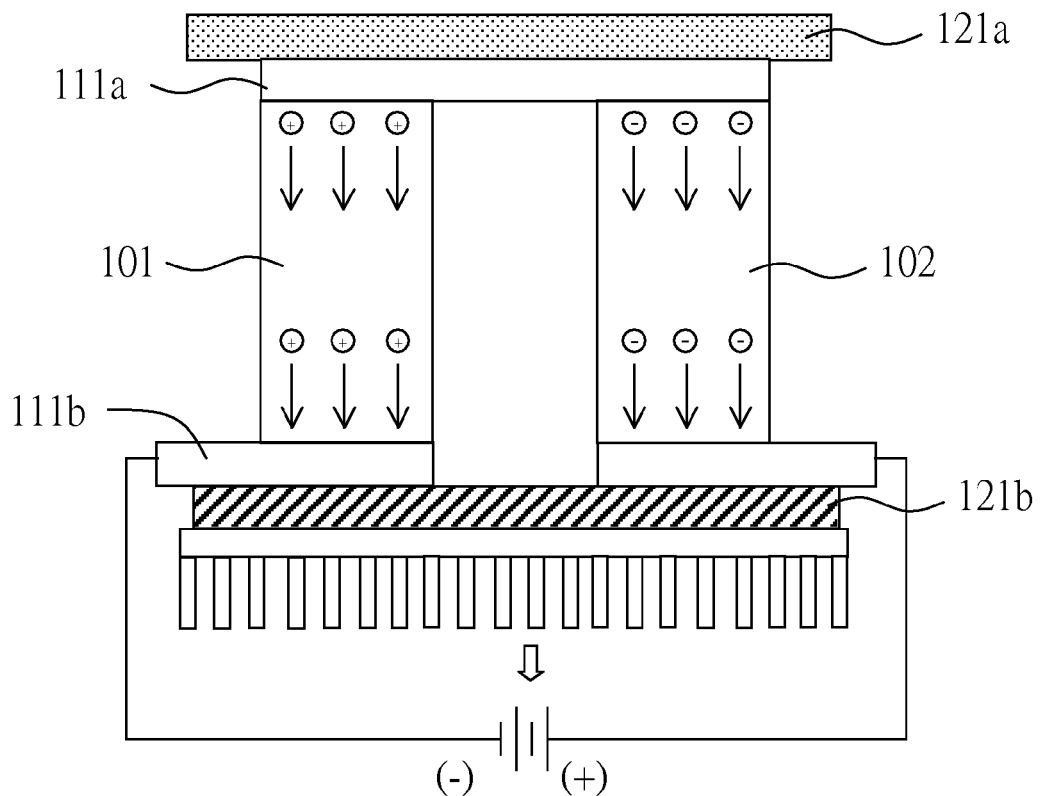
FIG. 1 (prior art) is a cross-sectional view of a conventional thermoelectric apparatus.
Figure 2:
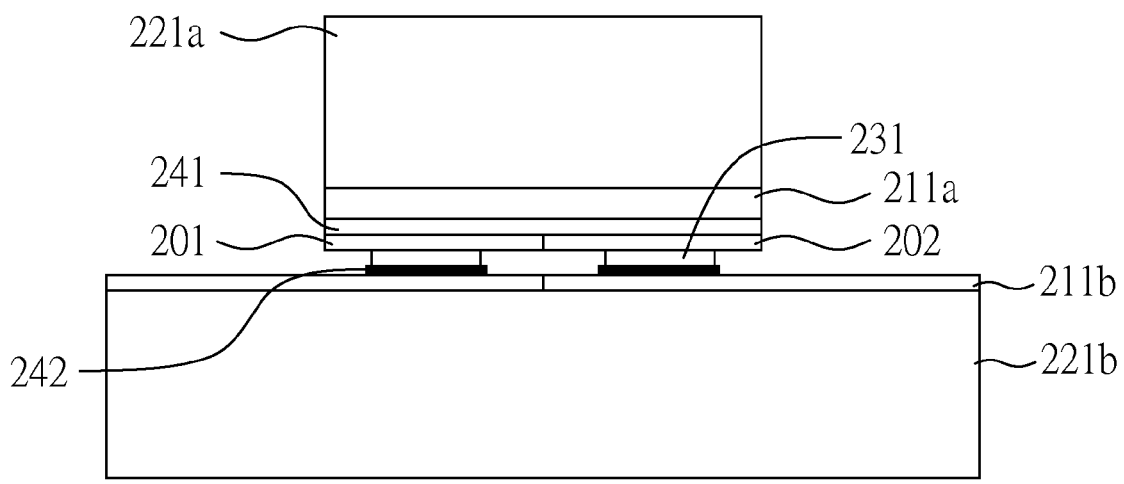
FIG. 2 (prior art) is a cross-sectional view of a conventional device having thermoelectric thin films.
Figure 3:
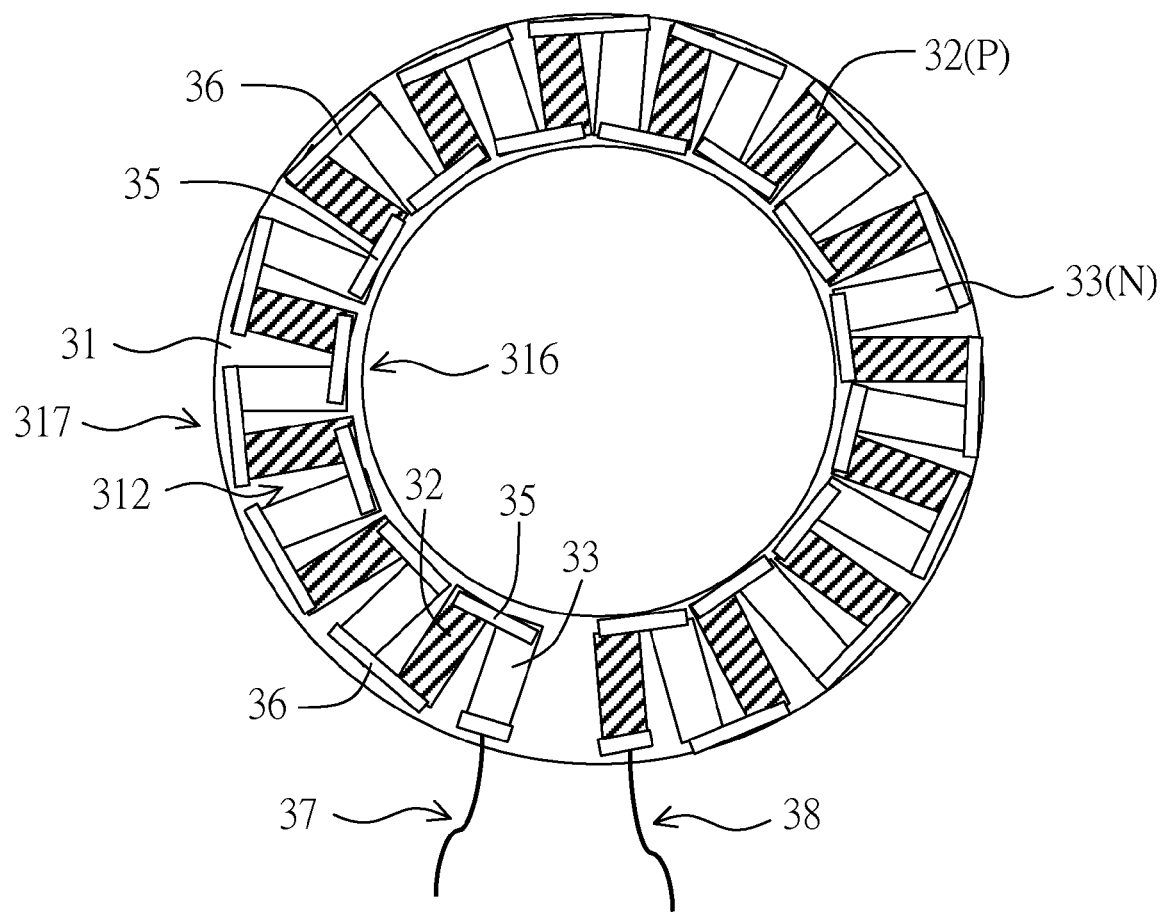
FIG. 3 is a top view of a thermoelectric device with thin film elements according to the first embodiment of the present invention.

FIG. 3 is a top view of a thermoelectric device with thin film elements according to the first embodiment of the present invention. The thermoelectric device 3 includes a ring-shaped insulated substrate 31 and plural sets of thermoelectric thin film material pair (TEP) disposed thereon. The ring-shaped insulated substrate 31 has a first surface 312, an inner rim 316 and an outer rim 317. Those sets of TEP electrically connected to each other are disposed on the first surface 312 of the ring-shaped insulated substrate 31. Each set of TEP includes a P-type thermoelectric thin film element (TEE) 32 and an N-type thermoelectric thin film element (TEE) 33 electrically connected to each other. Also, the N-type TEE 33 of each set of TEP is electrically connected to the P-type TEE 32 of the adjacent set of TEP. Each of the P-type TEE 32 and the N-type TEE 33 has a thickness in a range of 10 nm to 200 μm. Additionally, the sets of thermoelectric thin film material pair (TEP) are electrically connected to each other through conductors.

As shown in FIG. 3, several first conductors 35 and second conductors 36 are disposed on the first surface 312 and respectively close to the inner rim 316 and the outer rim 317 of the ring-shaped insulated substrate 31. In each set of TEP, the P-type TEE 32 and the N-type TEE 33 are electrically connected by the first conductor 35. Two adjacent sets of TEP are electrically connected by the second conductor 36. For example, the N-type TEE 33 of one set of TEP is electrically connected to the P-type TEE 32 of the adjacent set of TEP through the second conductor 36. The first conductors 35 and the second conductors 36 could be formed on the first surface 312 of the ring-shaped insulated substrate 31 by a deposition method.

The thermoelectric device 3 further includes conductive wires (such as the first conductive wire 37 and the second conductive wire 38) jointed to the conductors. As shown in FIG. 3, the first conductive wire 37 is electrically connected to the N-type TEE 33 of the set of TEP arranged in the first position through the first conductor 36, and the second conductive wire 38 is electrically connected to the P-type TEE 32 of the set of TEP arranged in the last position through the first conductor 36.

According to the thermoelectric device 3 illustrated in FIG. 3, the current flow direction (passing through the sets of TEP) is parallel to the surfaces of P-type TEE 32 and N-type TEE 33. When a current flows from the first set of TEP to the last set (the nth set, n≧2) of TEP, a temperature difference is created between the inner rim 316 (ex: cold side) and the outer rim 317 (ex: hot side) of the ring-shaped insulated substrate 31. Thus, because there is sufficient distance between the hot side and the cold side, the thermoelectric device designed according to the invention has solved the conventional heat-reflux problem. The heat-reflux problem occurred in the conventional thermoelectric device is generally resulted from the extremely close distance between the hot side and the cold side.

Figure 4A:
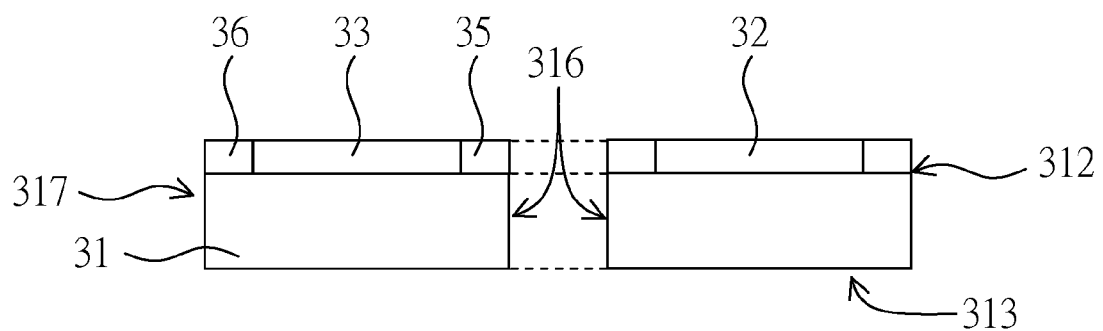
FIG. 4A is a cross-sectional view of the thermoelectric device of FIG. 3, which both illustrate the P-type TEE and N-type TEE formed on the first surface of the ring-shaped insulated substrate.
Figure 4B:
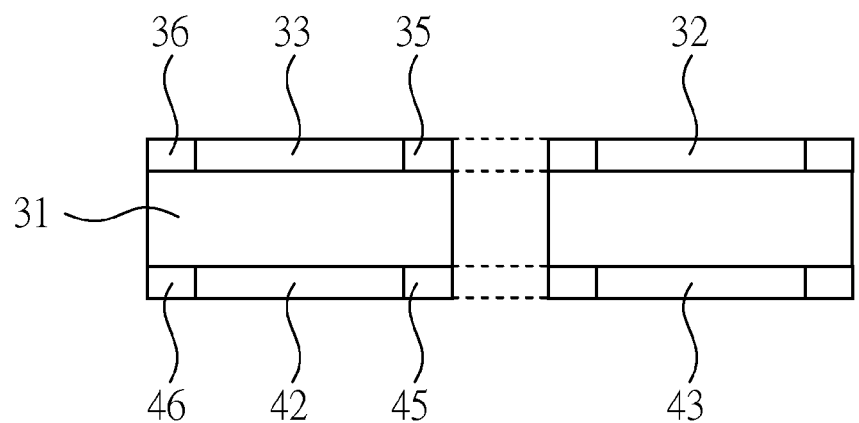
FIG. 4B is a cross-sectional view of another thermoelectric device with thin film elements according to the first embodiment of the present invention, which illustrates plural sets of TEP are deposited on the front and rear surfaces of the ring-shaped insulated substrate.

It is specially noted that positions of the P-type thermoelectric thin film elements (TEE) 32 and the N-type thermoelectric thin film elements (TEE) 33 are not limited in only one surface of the ring-shaped insulated substrate 31. Although the structure of FIG. 3 demonstrates the sets of thermoelectric thin film material pair (TEP) being disposed on the first surface 312 of the substrate 31, it would be beneficial to deposit more sets of TEP on the opposite surface of the substrate 31 for enhancing the conversion power of cooling/heating or electricity generation. Please refer to FIG. 4A and FIG. 4B. FIG. 4A is a cross-sectional view of the thermoelectric device of FIG. 3, which both illustrate the P-type TEE 32 and N-type TEE 33 formed on the first surface of the ring-shaped insulated substrate 31. FIG. 4B is a cross-sectional view of another thermoelectric device with thin film elements according to the first embodiment of the present invention, which illustrates plural sets of TEP are deposited on the front and rear surfaces of the ring-shaped insulated substrate 31.

As shown in FIG. 4B, the first surface 312 and the second surface 313 are referred to the front and rear surfaces of the ring-shaped insulated substrate 31. Several second sets of TEP are deposited on the second surface 313 of the ring-shaped insulated substrate 31. Each second set of TEP includes a P-type thermoelectric thin film element (TEE) 42 and an N-type thermoelectric thin film element (TEE) 43 electrically connected to each other. Also, the N-type TEE 43 of each second set of TEP is electrically connected to the P-type TEE 42 of the adjacent set of TEP. Similarly, the second sets of TEP are electrically connected in series. The thermoelectric device of FIG. 4B further includes the third conductors 45 and the fourth conductors 46, respectively close to the inner rim 316 and the outer rim 317 of the ring-shaped insulated substrate 31. In each second set of TEP, the P-type TEE 42 and the N-type TEE 43 are electrically connected by one third conductor 45 (close to the inner rim 316 of the substrate 31). Two adjacent second sets of TEP are electrically connected by the fourth conductor 46 (close to the outer rim 317 of the substrate 31). For example, the N-type TEE 43 of one second set of TEP is electrically connected to the P-type TEE 42 of the adjacent second set of TEP through the fourth conductor 46. The top view of the thermoelectric device showing the arrangement of thin film elements and relative components of FIG. 4B is similar to FIG. 3.

It is, of course, known by the people skilled in the art that the sets of thermoelectric thin film material pair (TEP) can be formed on either one surface (as shown in FIG. 3 and FIG. 4A) or two surfaces (front and rear, as shown in FIG. 4B) of the ring-shaped insulated substrate 31, depending on the practical requirements of the applications. The numbers and disposing positions (i.e. on single or two surfaces of the substrate 31) of sets of TEP can be optionally adjusted, and the present invention has no limitation thereto.

Additionally, the ring-shaped insulated substrate 31 has properties of electrical and heat insulation. Material examples of the ring-shaped insulated substrate 31 include ceramic materials such as Zirconium Oxide and tungsten (IV) selenide, and heat resistant polymer such as polyimide. The present invention has no special limitations to the practical materials of the ring-shaped insulated substrate 31.

Many semiconductor, amphoteric elements and compounds with high ZT values could be used as P-type and N-type thermoelectric thin film elements of the thermoelectric device. Examples of high ZT thermoelectric materials include $(BiSb)_2(TeSe)_3$, PbTe, PbSnTe, Si and SiGe, Half-Heusler alloy (with magnetic property), silicide, and WSe2. Also, the P-type and N-type thermoelectric thin film elements could be deposited on the surface(s) of the substrate 31 by sputtering deposition, thermal deposition, arc ion plating deposition, chemical vapor deposition, electrolytic deposition and electroless deposition. It is noted that the materials and deposition methods are selected according to the requirements of the practical applications, and the present invention has no limitation thereto.

The conductors, including the first conductors 35, the second conductors 36, the third conductors 45, the fourth conductors 46, could be made of conductive metals with low resistance, such as Cu, Fe, Cr, Ni, Mo, Sn, Ag, Au, and alloys thereof. Similarly, the materials of conductors could be optionally chosen according to the requirements of the practical applications, and not limited to the materials disclosed herein.

Second Embodiment

In the second embodiment, a thermoelectric apparatus is disclosed, which is constructed by attaching insulation layers to upper side and lower side of the thermoelectric device of the first embodiment. In the practical applications of the conversion power of cooling/heating or electricity generation, the thermoelectric apparatus could be assembled with a heat conduction module. In the second embodiment, the front and rear surfaces of the substrate includes several sets of thermoelectric thin film material pair (TEP).

Figure 5A:
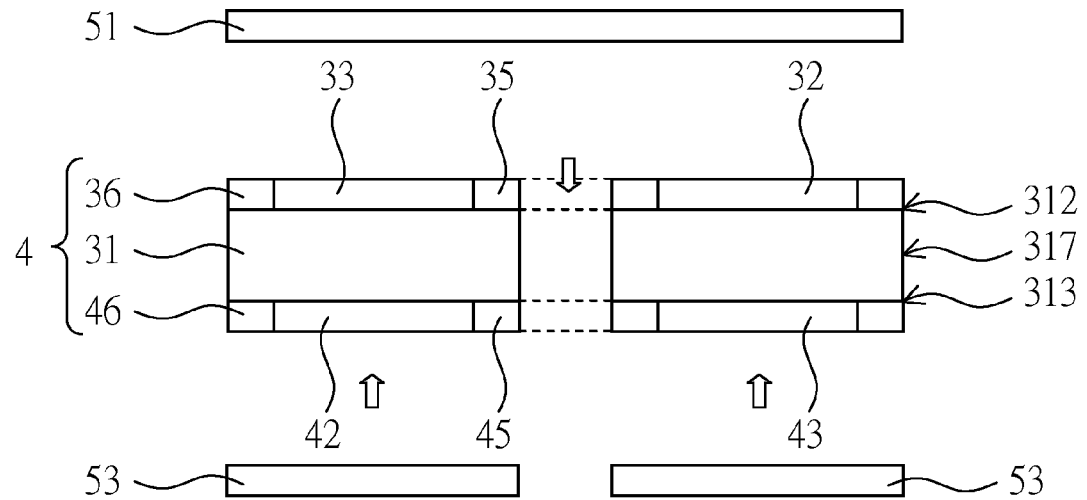
Figure 5B:
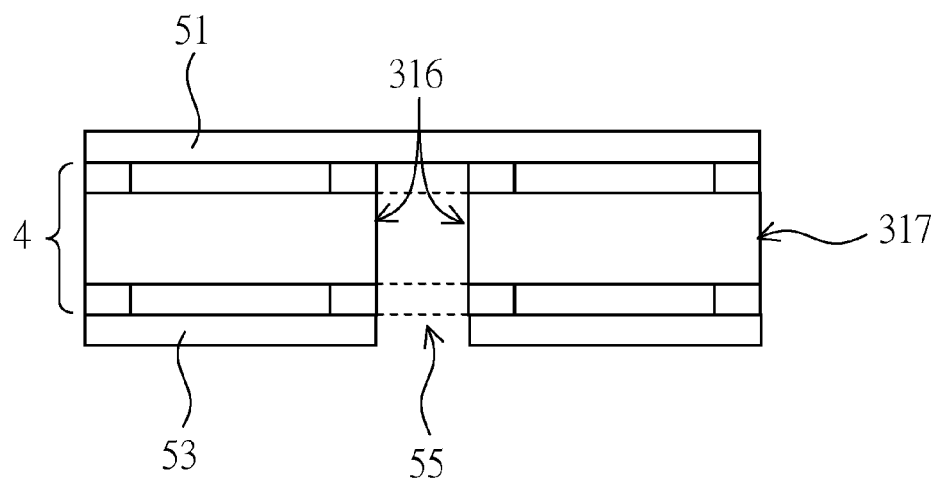

FIG. 5A and FIG. 5B are cross-sectional view of a thermoelectric apparatus having thermoelectric device with thin film elements according to the second embodiment of the present invention, wherein FIG. 5B illustrates the apparatus of FIG. 5A after assembly. The components in FIG. 5A and FIG. 5B identical to that in FIG. 4B are denoted with the same reference numbers.

As shown in FIG. 5A, a thermoelectric device with thin film elements 4, including a ring-shaped insulated substrate 31 and plural first and second sets of TEP disposed thereon, is provided. The first sets of TEP are disposed on the first surface 312 (i.e. the front surface) of the ring-shaped insulated substrate 3, while the second sets of TEP are disposed on the second surface 313 (i.e. the rear surface) of the ring-shaped insulated substrate 31.

Each first set of TEP includes a P-type thermoelectric thin film element (TEE) 32 and an N-type thermoelectric thin film element (TEE) 33 electrically connected to each other. Also, the N-type TEE 33 of each first set of TEP is electrically connected to the P-type TEE 32 of the adjacent first set of TEP. In each first set of TEP, the P-type TEE 32 and the N-type TEE 33 are electrically connected by one first conductor 35 (close to the inner rim 316 of the substrate 31). Two adjacent first sets of TEP are electrically connected by the second conductor 36 (close to the outer rim 317 of the substrate 31). For example, the N-type TEE 33 of one first set of TEP is electrically connected to the P-type TEE 32 of the adjacent first set of TEP through the second conductor 36.

Similarly, each second set of TEP includes a P-type thermoelectric thin film element (TEE) 42 and an N-type thermoelectric thin film element (TEE) 43 electrically connected to each other. Also, the N-type TEE 43 of each second set of TEP is electrically connected to the P-type TEE 42 of the adjacent second set of TEP. In each second set of TEP, the P-type TEE 42 and the N-type TEE 43 are electrically connected by the third conductor 45 (close to the inner rim 316 of the substrate 31). Two adjacent second sets of TEP are electrically connected by the fourth conductor 46 (close to the outer rim 317 of the substrate 31). For example, the N-type TEE 43 of one second set of TEP is electrically connected to the P-type TEE 42 of the adjacent second set of TEP through the fourth conductor 36. When a current flows through the first and second sets of TEE orderly in a direction parallel to the surfaces of the P-type TEE 32/42 and the N-type TEE 33/43, a temperature difference is created between the inner rim 316 (ex: cold side) and the outer rim 317 (ex: hot side) of the ring-shaped insulated substrate 31.

Then, a first insulation layer 51 and a second insulation layer 53 are respectively assembled to the upper side and the lower side of the thermoelectric device, and the assembly-completed thermoelectric apparatus 5 according to the second embodiment is illustrated in FIG. 5B. As shown in FIG. 5B, the first insulation layer 51 is disposed on the first surface 312 of the ring-shaped insulated substrate 31 and covers the first set of TEP. The second insulation layer 53 is disposed on the second surface 313 of the ring-shaped insulated substrate 31 and covers the second set of TEP. Also, there is a through hole 55 formed in the center of the second insulation layer 53 and the inner rim 316 of the ring-shaped insulated substrate 31.

Additionally, the first insulation layer 51 and the second insulation layer 53 are preferably made of materials with properties of electrical and heat insulation. Material examples of the first insulation layer 51 and the second insulation layer 53 include ceramic materials such as zirconium oxide and tungsten (IV) selenide, and heat-resistant polymer such as polyimide. The present invention has no special limitations to the materials of the insulation layers (51/53).

Figure 6A:
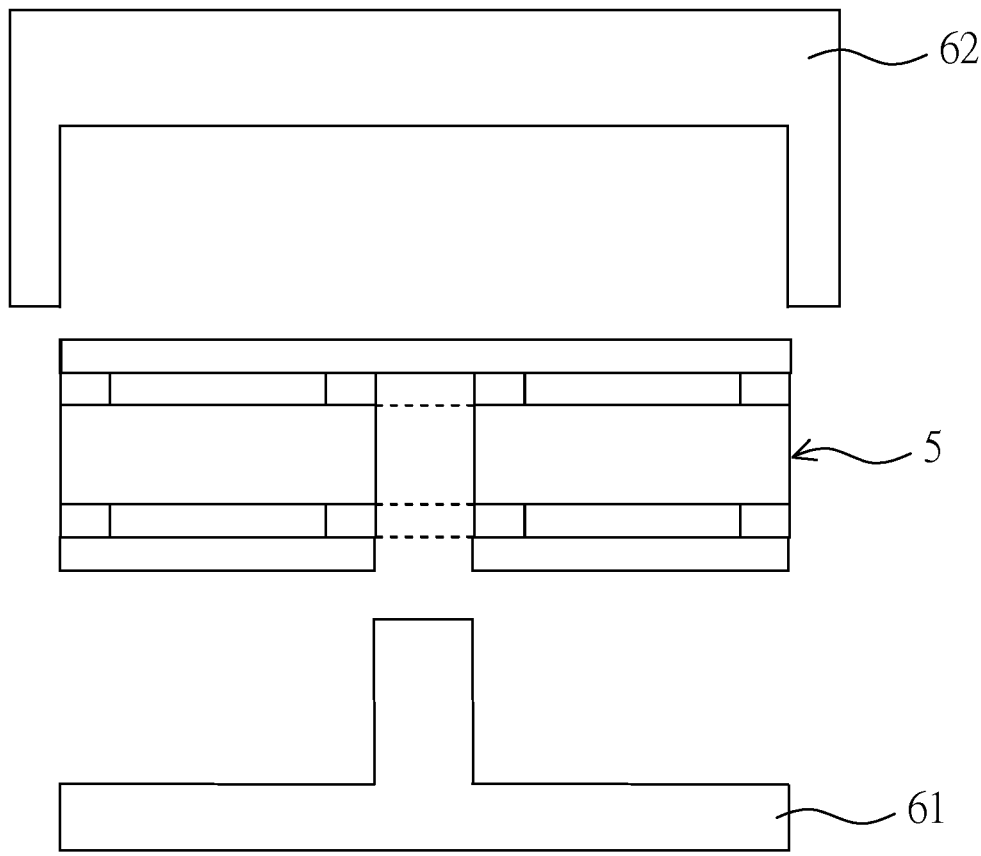
Figure 6B:
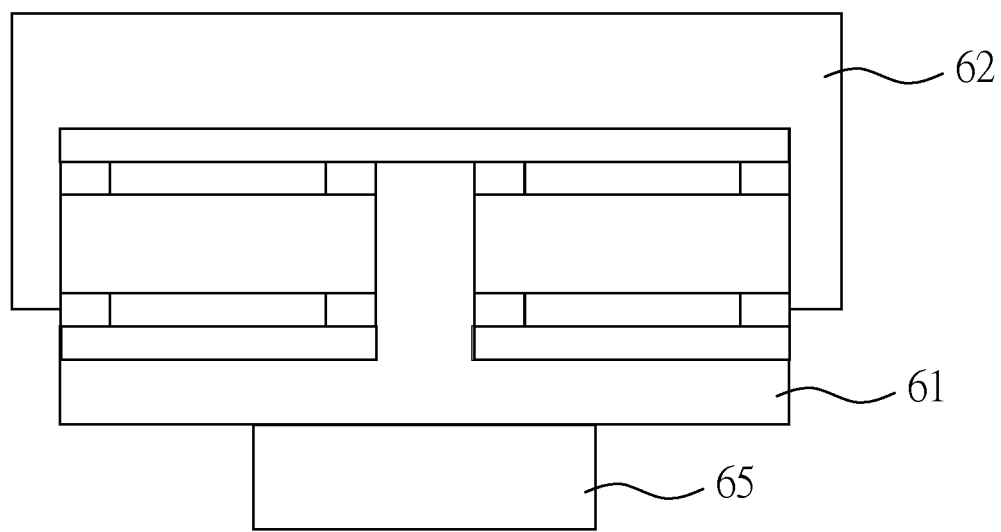

During practical application, two sides (i.e. cold end and hot end) of the thermoelectric apparatus 5 illustrated in FIG. 5B could be assembled with the electricity-insulated heat conduction modules. FIG. 6A and FIG. 6B are cross-sectional view of a thermoelectric apparatus having thermoelectric device with thin film elements assembled with first type heat conduction modules according to the present invention, wherein FIG. 6B illustrates the structure of FIG. 6A after assembly.

As shown in FIG. 6A and FIG. 6B, the first heat conduction module 61 contacts the inner rim 316 (ex: cold side) of the ring-shaped insulated substrate 31 by the through hole 55 of the thermoelectric apparatus 5, while the second heat conduction module 63 contacts the outer rim 317 (ex: hot side) of the ring-shaped insulated substrate 31.

Figure 7A:
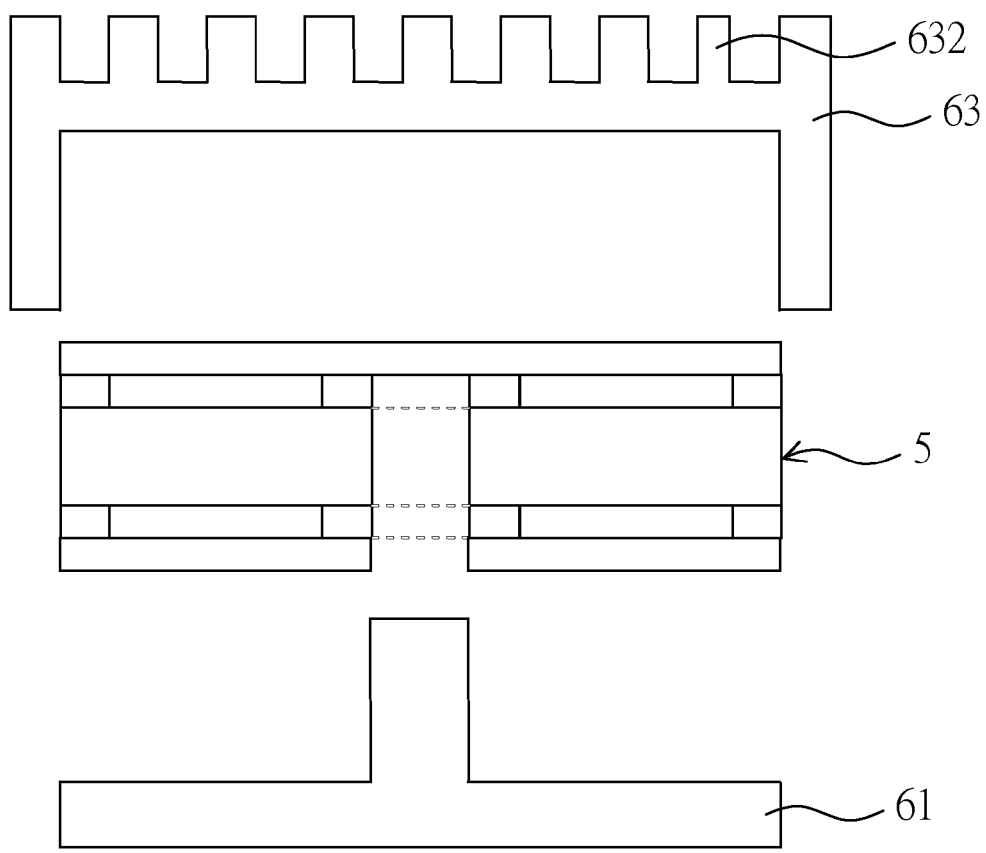
Figure 7B:
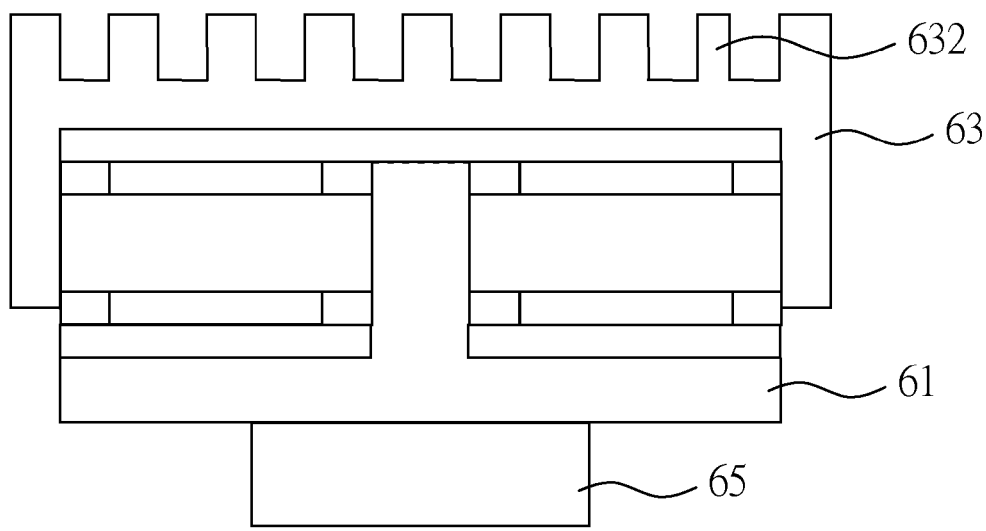

Besides the heat conduction module of FIG. 6A and FIG. 6B, the thermoelectric apparatus 5 of FIG. 5B could be assembled with different types of heat conduction modules. FIG. 7A and FIG. 7B are cross-sectional view of the thermoelectric apparatus of the present invention assembled with second type heat conduction modules, wherein FIG. 7B illustrates the structure of FIG. 7A after assembly. As shown in FIG. 7A and FIG. 7B, the outer surface of the second heat conduction module 63 includes several fins for enhancing the heat dissipation efficiency.

The current flows through the first and second sets of TEE orderly in a direction parallel to the surfaces of the P-type TEE 32/42 and the N-type TEE 33/43. Whether the first type heat conduction modules or the second type heat conduction modules are assembled with the thermoelectric apparatus 5, a current flow direction is perpendicular to a heat conduction direction (i.e. heat transferring between the lower and the upper sides of the thermoelectric apparatus 5).

Moreover, the present invention could be applied in a variety of applications including cooling/heating industry and power generation fields. In the cooling/heating application, the first heat conduction module 61 of the structure shown in FIG. 6B or FIG. 7B could be adhered to a heat source (ex: CPU) 65. After a current is loaded into the thermoelectric apparatus 5, the heat source 65 can be cooled since the first heat conduction module 61 contacts the inner rim 316 (ex: cold side) of the ring-shaped insulated substrate 31. In the power generation application, a heat source (such as an exhaust pipe) can be plugged into the through hole 55 of the thermoelectric apparatus 5, and a direct current can be consequently generated due to the temperature difference between the inner rim 316 and the outer rim 317.

Third Embodiment

In the first and second embodiments, only one ring-shaped insulated substrate 31 is used in the thermoelectric device. In the practical applications, however, two or more ring-shaped insulated substrates could be laminated to form a stack of thermoelectric devices for enhancing the efficiency of thermoelectric conversion. It is, of course, noted that plural sets of TEP could be formed on either one surface or both (i.e. front and rear) surfaces of each substrate, and the present invention has no limitation herein.

Figure 8A:
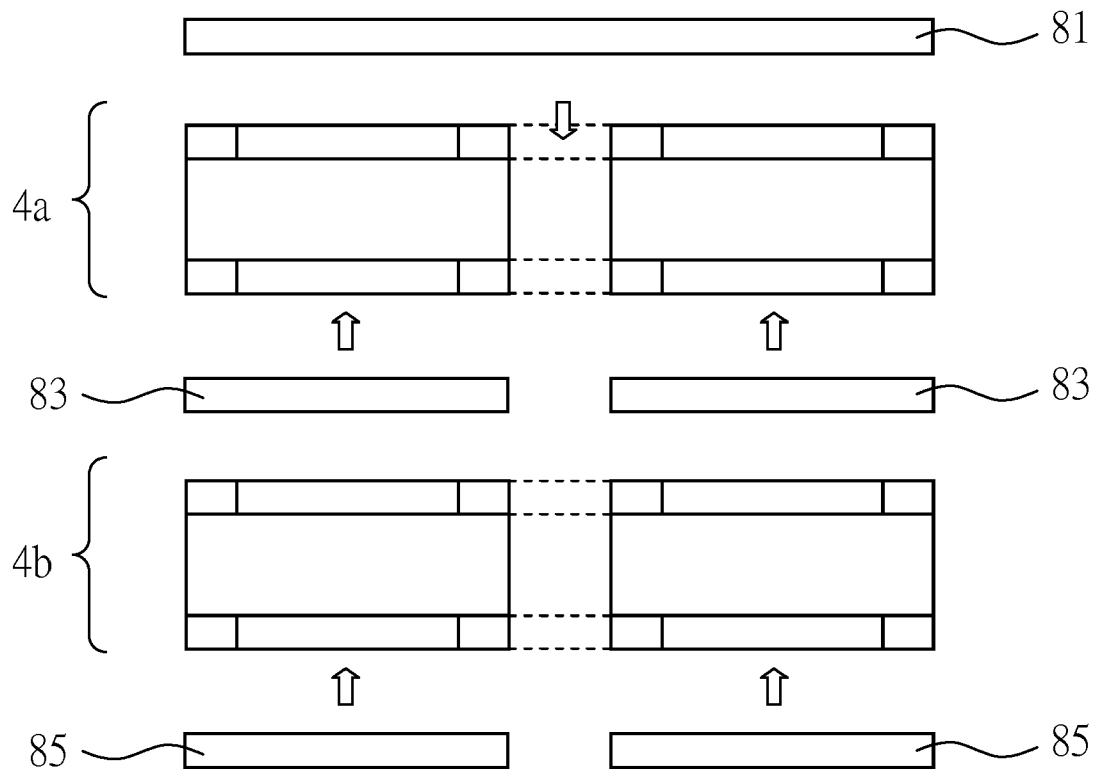
Figure 8B:
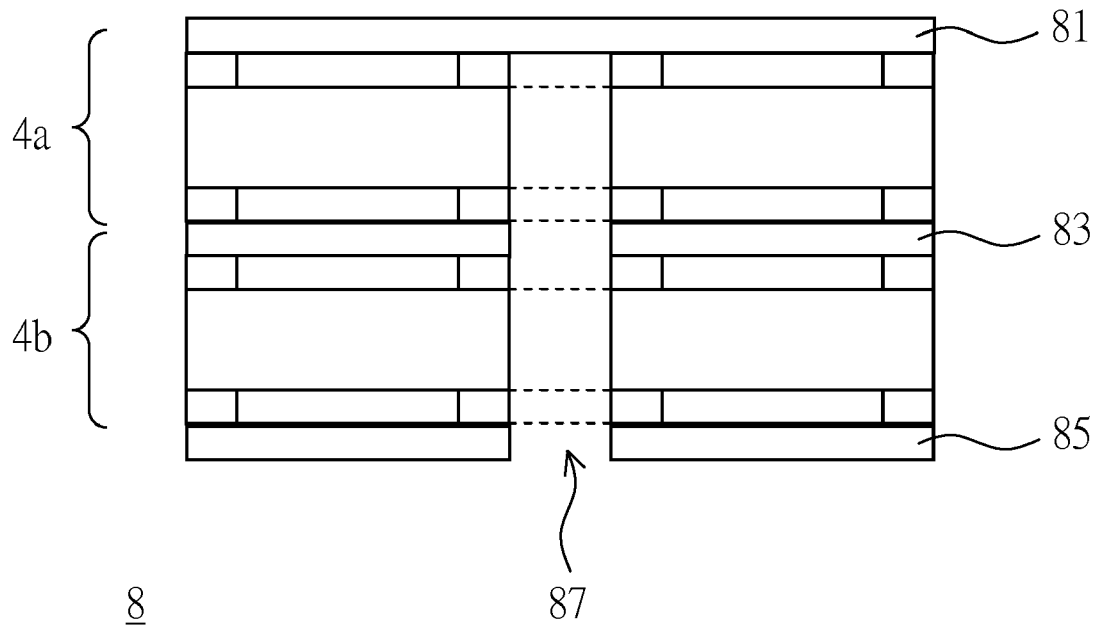

FIG. 8A and FIG. 8B are cross-sectional view of a stack of thermoelectric devices with thin film elements according to the third embodiment of the present invention, wherein FIG. 8B illustrates the stack of FIG. 8A after assembly. Also, the stack constructed by two ring-shaped insulated substrates is illustrated in the third embodiment.

In the third embodiment, the stack 8 includes a first insulation layer 81, a first thermoelectric device 4a, a second insulation layer 83, a second thermoelectric device 4b and a third insulation layer 85. After assembly, there is a through hole 87 in the center of the second insulation layer 83 and the third insulation layer 85 and the inner rims of two substrates, as shown in FIG. 8B. Also, each of the first and second thermoelectric devices 4a/4b herein could be identical to the thermoelectric device 4 of FIG. 4B, which plural sets of TEP are disposed on the front and rear surfaces of the substrate. Please refer to first embodiment for structural details of the first and second thermoelectric devices 4a/4b.

As shown in FIG. 8A and FIG. 8B, the first insulation layer 81 is disposed on the top surface of the first thermoelectric devices 4a and covers the TEP sets formed on the relative ring-shaped insulated substrate. The second insulation layer 83 is disposed between the first thermoelectric devices 4a and the second thermoelectric devices 4b. The third insulation layer 85 is disposed on the bottom surface of the second thermoelectric devices 4b and covers the TEP sets formed on the relative ring-shaped insulated substrate. When a current flows through the TEP sets of the first and second thermoelectric devices 4a/4b, a temperature difference is created between the inner rims (ex: cold side) and the outer rims (ex: hot side) of the ring-shaped insulated substrates. Similarly, the current flows in a direction parallel to the surfaces of the TEP sets.

In the aforementioned descriptions, a current flowing through the TEP sets is in a direction parallel to the surfaces of the P-type TEE 32 and the N-type TEE 33 according to the embodiments of the present invention. Thus, there is sufficient distance between the hot side and the cold side of the thermoelectric device, and the conventional heat-reflux problem (resulted from the extremely small distance between the hot side and the cold side) can be avoided. Also, the numbers of TEP sets can be doubled by simply depositing the P-type and N-type thermoelectric thin film elements on the front and rear surfaces of the substrate, so that the conversion power of cooling/heating and electricity generation can be greatly increased. Accordingly, the efficiency of the thermoelectric device designed according to the embodiments of the present invention can be effectively improved by using high ZT thermoelectric materials without a waste.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A thermoelectric apparatus, at least comprising:

a ring-shaped insulated substrate, having an inner rim, an outer rim, a top surface and a bottom surface, wherein the ring-shaped insulated substrate has a through hole vertically penetrating from the top surface to the bottom surface, and the inner rim abuts the through hole's sidewall, said through hole having an opening abutting the top surface;

plural first sets of thermoelectric thin film material pair (TEP), the first sets of TEP disposed on the top surface of the ring-shaped insulated substrate and electrically connected to each other, each first set of TEP including a P-type thermoelectric thin film element (TEE) and an N-type TEE electrically connected to each other, and the N-type TEE of each first set of TEP electrically connected to the P-type TEE of the adjacent first set of TEP; and a first insulation layer, disposed on the top surface of the ring-shaped insulated substrate, and covering the first set of TEP and covering the opening of the through hole;

wherein when a current flows through the first sets of TEP orderly along a direction parallel to the surfaces of P-type and N-type thermoelectric thin film elements, a temperature difference is generated between the inner rim and the outer rim of the ring-shaped insulated substrate.

2. The thermoelectric apparatus according to claim 1 further comprising:

plural first conductors, disposed on the top surface and close to the inner rim of the ring-shaped insulated substrate, and each first conductor electrically connecting the P-type TEE and the N-type TEE of each first set of TEP; and plural second conductors, disposed on the top surface and close to the outer rim of the ring-shaped insulated substrate, and each second conductor electrically connecting the N-type TEE of the first set of TEP and the P-type TEE of the adjacent first set of TEP.

3. The thermoelectric apparatus according to claim 2 further comprising:

a first conductive wire, electrically connecting the P-type TEE of the first set of TEP arranged in a first position; and a second conductive wire, electrically connecting the N-type TEE of the first set of TEP arranged in a last position.

4. The thermoelectric apparatus according to claim 2 further comprising:

plural second sets of thermoelectric thin film material pair (TEP), the second sets of TEP disposed on the bottom surface of the ring-shaped insulated substrate and electrically connected to each other, each second set of TEP including a P-type thermoelectric thin film element (TEE) and an N-type TEE electrically connected to each other, and the N-type TEE of each second set of TEP electrically connected to the P-type TEE of the adjacent second set of TEP; and a second insulation layer, disposed on the bottom surface of the ring-shaped insulated substrate and covering the second set of TEP.

5. The thermoelectric apparatus according to claim 4 further comprising:

plural third conductors, disposed on the bottom surface and close to the inner rim of the ring-shaped insulated substrate, and each third conductor electrically connecting the P-type TEE and the N-type TEE of each second set of TEP; and plural fourth conductors, disposed on the bottom surface and close to the outer rim of the ring-shaped insulated substrate, and each fourth conductor electrically connecting the N-type TEE of the second set of TEP and the P-type TEE of the adjacent second set of TEP.

6. The thermoelectric apparatus according to claim 4, wherein the through hole further vertically penetrates the second insulation layer.

7. The thermoelectric apparatus according to claim 6, wherein a first heat conduction module contacts the inner rim of the ring-shaped insulated substrate by the through hole, and a second heat conduction module contacts the outer rim of the ring-shaped insulated substrate.

8. The thermoelectric apparatus according to claim 7, wherein an outer surface of the second heat conduction module includes several fins.

9. The thermoelectric apparatus according to claim 7, wherein when a current flows through the first and second sets of TEE orderly in a direction parallel to the surfaces of the P-type TEE and the N-type TEE, a heat conduction direction between the first and second heat conduction modules is perpendicular to the current flow direction.

10. The thermoelectric apparatus according to claim 1, wherein each of the P-type thermoelectric thin film elements (TEE) and the N-type TEE has a thickness of 10 nm to 200 μm.

11. The thermoelectric apparatus according to claim 1, wherein a penetrating direction of the through hole is perpendicular to the first sets of TEP which are flatly formed on the top surface of the ring-shaped insulated substrate.

12. The thermoelectric apparatus according to claim 1, wherein the bottom surfaces of the first sets of TEP entirely contact the top surface of ring-shaped insulated substrate.

13. The thermoelectric apparatus according to claim 2, the bottom surfaces of the first and second conductors entirely contact the top surface of ring-shaped insulated substrate.

14. A thermoelectric stack with thermoelectric thin film elements, at least comprising:

a first thermoelectric device, comprising:

a first ring-shaped insulated substrate, having an inner rim, an outer rim, a top surface and a bottom surface; and plural first sets of thermoelectric thin film material pair (TEP), the first sets of TEP disposed on the top surface of the ring-shaped insulated substrate and electrically connected to each other, each first set of TEP including a P-type thermoelectric thin film element (TEE) and an N-type TEE electrically connected to each other, and the N-type TEE of each first set of TEP electrically connected to the P-type TEE of the adjacent first set of TEP;

a first insulation layer, disposed on the top surface of the ring-shaped insulated substrate, and covering the first set of TEP;

a second thermoelectric device, comprising:

a second ring-shaped insulated substrate, having an inner rim, an outer rim, a top surface and a bottom surface; and plural second sets of thermoelectric thin film material pair (TEP), the second sets of TEP disposed on the top surface of the second ring-shaped insulated substrate and electrically connected to each other, each second set of TEP including a P-type thermoelectric thin film element (TEE) and an N-type TEE electrically connected to each other, and the N-type TEE of each second set of TEP electrically connected to the P-type TEE of the adjacent second set of TEP;

a second insulation layer, disposed between the first thermoelectric device and the second thermoelectric device;

a third insulation layer, disposed on the bottom surface of the second ring-shaped insulated substrate of the second thermoelectric device; and a through hole, vertically penetrating the first thermoelectric device, the second insulation layer, the second thermoelectric device and the third insulation layer of the thermoelectric stack, wherein the inner rims of the first and second ring-shaped insulated substrates abut the through hole's sidewall, said through hole having an opening abutting the top surface of said first ring-shaped insulated substrate, and wherein the first insulation layer covers the opening of the through hole;

wherein the first thermoelectric device is vertically stacked above the second thermoelectric device, when a current flows through the first and second sets of TEP orderly along a direction parallel to the surfaces of P-type and N-type thermoelectric thin film elements, a temperature difference is generated between the inner rim and the outer rim of the first and second ring-shaped insulated substrates.

15. The thermoelectric stack according to claim 14, wherein the first thermoelectric device further comprises:

plural first conductors, disposed on the top surface and close to the inner rim of the first ring-shaped insulated substrate, and each first conductor electrically connecting the P-type TEE and the N-type TEE of each first set of TEP; and plural second conductors, disposed on the top surface and close to the outer rim of the first ring-shaped insulated substrate, and each second conductor electrically connecting the N-type TEE of the first set of TEP and the P-type TEE of the adjacent first set of TEP.

16. The thermoelectric stack according to claim 14, wherein the first thermoelectric device further comprises:

plural third sets of thermoelectric thin film material pair (TEP), the third sets of TEP disposed on the bottom surface of the first ring-shaped insulated substrate and electrically connected to each other, each third set of TEP including a P-type thermoelectric thin film element (TEE) and an N-type TEE electrically connected to each other, and the N-type TEE of each third set of TEP electrically connected to the P-type TEE of the adjacent third set of TEP.

17. The thermoelectric stack according to claim 16, wherein the second thermoelectric device further comprises:

plural fourth sets of thermoelectric thin film material pair (TEP), the fourth sets of TEP disposed on the bottom surface of the second ring-shaped insulated substrate and electrically connected to each other, each fourth set of TEP including a P-type thermoelectric thin film element (TEE) and an N-type TEE electrically connected to each other, and the N-type TEE of each fourth set of TEP electrically connected to the P-type TEE of the adjacent fourth set of TEP.

18. The thermoelectric stack according to claim 14, wherein the through hole vertically penetrates the first and second ring-shaped insulated substrates, and a penetrating direction of the through hole is perpendicular to the first sets of TEP and the second sets of TEP, which the first and second sets of TEP are flatly formed on the top surfaces of the first and second ring-shaped insulated substrates respectively.

19. The thermoelectric stack according to claim 18, wherein a first heat conduction module contacts the inner rims of the first and second ring-shaped insulated substrates by the through hole, and a second heat conduction module contacts the outer rims of the first and second ring-shaped insulated substrates.

20. The thermoelectric stack according to claim 19, wherein an outer surface of the second heat conduction module includes several fins.

21. The thermoelectric stack according to claim 19, wherein when a current flows through the first and second sets of TEE orderly in a direction parallel to the surfaces of the P-type TEE and the N-type TEE, a heat conduction direction between the first and second heat conduction modules is perpendicular to the current flow direction.

22. The thermoelectric stack according to claim 14, wherein each of the P-type thermoelectric thin film elements (TEE) and the N-type TEE has a thickness of 10 nm to 200 µm.

23. The thermoelectric stack according to claim 14, wherein the bottom surfaces of the first sets of TEP entirely contact the top surface of first ring-shaped insulated substrate, the bottom surfaces of the second sets of TEP entirely contact the top surface of second ring-shaped insulated substrate.

24. The thermoelectric stack according to claim 15, wherein the bottom surfaces of the first and second conductors entirely contact the top surface of first ring-shaped insulated substrate.

* * * * *